United States Patent
Lloyd et al.

(10) Patent No.: US 6,175,280 B1
(45) Date of Patent: Jan. 16, 2001

(54) METHOD AND APPARATUS FOR CONTROLLING AND STABILIZING OSCILLATORS

(75) Inventors: Michael W. Lloyd, Cranberry Township; Lee M. Richey, Franklin, both of PA (US)

(73) Assignee: Radio Adventures Corporation, Franklin, PA (US)

( * ) Notice: Under 35 U.S.C. 154(b), the term of this patent shall be extended for 0 days.

(21) Appl. No.: 09/126,523

(22) Filed: Jul. 30, 1998

Related U.S. Application Data

(60) Provisional application No. 60/054,457, filed on Aug. 1, 1997.

(51) Int. Cl.$^7$ ....................................................... H04B 1/16
(52) U.S. Cl. ..................... 331/1 R; 331/175; 331/177 R; 455/192.2; 455/75; 455/76; 455/260; 375/344
(58) Field of Search ...................................... 331/1 R, 175, 331/177 R, 1 A; 455/192.2, 119, 120, 260, 75, 170.1; 324/76.41; 375/344

(56) References Cited

U.S. PATENT DOCUMENTS

| | | | |
|---|---|---|---|
| 3,573,649 | 4/1971 | West | 331/14 |
| 3,959,737 | 5/1976 | Tanis | 331/1 A |
| 4,041,416 | 8/1977 | Glance | 331/96 |
| 4,121,170 | 10/1978 | Hartmann et al. | 331/1 A |
| 4,380,743 | 4/1983 | Underhill et al. | 331/1 A |
| 4,453,269 | 6/1984 | Skar | 455/129 |
| 4,567,448 | 1/1986 | Ikeda | 331/25 |
| 4,921,467 | 5/1990 | Lax | 455/264 |
| 5,038,120 | 8/1991 | Wheatley et al. | 332/128 |
| 5,046,135 | 9/1991 | Hatcher | 455/303 |
| 5,245,637 | 9/1993 | Gersbach et al. | |
| 5,381,116 | 1/1995 | Nuckolls et al. | 331/1 A |
| 5,450,621 | 9/1995 | Kianush et al. | 445/192.2 |
| 5,469,478 | 11/1995 | Lee | 375/376 |
| 5,506,875 | 4/1996 | Nuckolls et al. | 375/375 |
| 5,542,113 | 7/1996 | Fink et al. | 455/119 |

OTHER PUBLICATIONS

Frequency Stabilization of L–C Oscillators by Klaas Spaargaren, PA0KSB, Feb. 1996; pp. 19–23 of QEX.

A Drift–Free VFO by Jacob Makhinson, N6NWP, Dec. 1996; pp. 32–36 of QSTz.

*Primary Examiner*—Arnold Kinkead
(74) *Attorney, Agent, or Firm*—Lovercheck and Lovercheck

(57) ABSTRACT

A system for frequency stabilization and control is provided. The circuit according to the invention consists of three major subsystems; namely, a display and control module, an integrator module, and a voltage controlled oscillator. The electronic system disclosed provides a highly flexible method of frequency stabilization and control. The system is programmable and may be used in a wide variety of applications, offering a variety of advantages over conventional systems such as PLLs.

12 Claims, 13 Drawing Sheets

| Fig-2A |
|--------|
| Fig-2B |

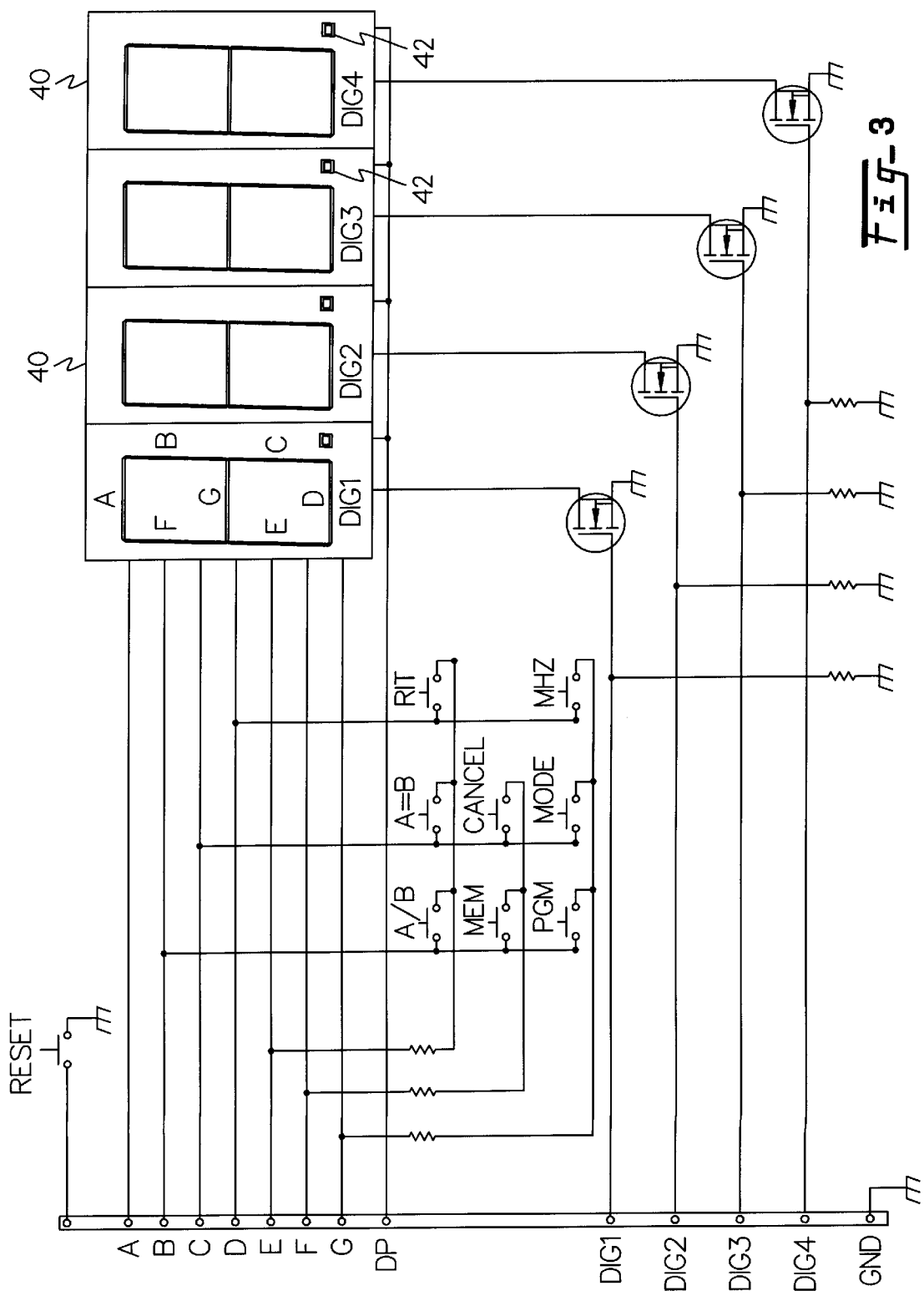

METHOD AND APPARATUS FOR CONTROLLING AND STABILIZING OSCILLATORS

This application claims the benefit of U.S. Provisional Application Ser. No. 60/054,457, filed Aug. 1, 1997.

BACKGROUND OF THE INVENTION

This invention relates to frequency control circuits and more particularly to an electronic system that provides a highly flexible frequency stabilization control.

There is a need for a frequency stabilizer that is simple in construction, economical to manufacture and simple and efficient to use.

Conventional variable frequency oscillators (VFO) have been used for decades for tuning various types of radio and test equipment. However, oscillator drift is often caused by temperature variations that occur because of changes in ambient temperature and self heating of the components. These frequency changes can sometimes be reduced by the use of temperature sensitive components applied in a way to counteract the changes occurring to the oscillator frequency. Such temperature compensation is a tedious process and often is not consistent In other cases, the oscillator frequency may change because of changes in circuit loading or because of changes in operating voltage, for instance when a unit is powered by battery and the battery is running down.

Frequency synthesizers were developed to correct the frequency drift problem of VFO's and to provide a means of electronic control of oscillators from computer type equipment in addition to manual operator input.

The principle methods of frequency synthesis are the phase locked loop (PLL) and direct digital synthesis (DDS) systems and certain combinations of both. Another method being used by some is the use of a conventional electronic or mechanically tuned oscillator that is stabilized by a digital circuit which locks the oscillator to specific increments of frequency within the operating range of the oscillator.

Phase locked loops are a popular method of creating a stable VFO with digital features. However, if small tuning step size is desired, either circuit complexity increases or performances, with respect to phase noise, decreases. Because the loop is continually correcting phase errors in the VFO signal, noise is added to the output of the oscillator outside the loop bandwidth. Depending upon operating conditions, this added noise can cause a reduction in receiver performance on weak signals in the presence of strong signals. The PLL can reduce noise near the oscillator frequency including microphonics if the loop bandwidth permits. It is also common to encounter spurious responses when tuning across strong signals.

Direct digital synthesizers can produce very small tuning steps with low phase noise, but their upper frequency of operation is limited in practical applications and they add discrete spurious signals up and down the frequency spectrum around the operating frequency. These spurs can usually be suppressed below required levels for transmitter applications but they may not be sufficiently low for use in high performance receiver applications. To reduce these spurious responses, a wide bandwidth PLL operating as a tracking filter is often added to the DDS output, adding complexity, power consumption and cost. A DDS can switch frequency in microseconds if needed and can produce phase shift keyed outputs facilitating applications requiring such features. Like a PLL, the DDS requires a specially programmed controller for each application The present system combines the best feature of conventional VFO's and digital control circuitry to produce oscillators with high frequency stability and a means to provide electric control in addition to manual operator input.

Unlike a PLL, the present system cannot reduce microphonics or noise near the oscillator frequency nor can it switch the oscillator frequency in microseconds like a DDS. However, it can tune the oscillator in small steps and, like the "huff and pull" system, it does not add noise or spurious signals in the process. It also provides very good long term frequency stability. Because the controller corrects frequency drift only as needed, and since drift in an oscillator is usually in one direction only, the system does not "hunt".

Another feature of the present system is that no special programming of the controller is required to use it. It can literally be moved from application to application without consideration of frequency step size, frequency limits and so on (within its operating range).

The circuit may be compared to a frequency controller chip. The chip measures the frequency of a voltage-controlled oscillator (VCO), reads a shaft encoder, controls the frequency, provides RIT capability, stores frequencies and setup parameters in any of 32 memories and displays measured frequency with a number of available offsets and multipliers. Unlike many designs using phase—locked loops (PLLs) and direct digital synthesis (DDS), techniques, this system does not require use of a controller preprogrammed with specific frequency limits or step sizes for the intended application. It is a general-purpose controller. The circuit provides a 10 Hertz tuning resolution over the frequency range of near DC to 50 MHZ and works at higher frequencies by using prescalers or frequency mixing schemes.

The circuit according to the invention consists of three major sub-systems; namely, a display and control module, an integrator module, and a voltage controlled oscillator. The electronic system disclosed provides a highly flexible method of frequency stabilization and control.

The display and control unit is capable of directly or indirectly measuring the frequency of an electrically tuned oscillator (VCO); reading an operator input device, a control signal input from another controlling device, or from a memory storage system to modify current operating frequency and parameters; controlling the frequency of the VCO by sending control pulses to an integrator or similar circuit; providing incremental tuning capability; storing frequencies and operating parameters in a variable number of memories and optionally displaying measured frequency with offsets and multipliers if desired.

The integrator converts control pulses from the control unit to a DC control voltage/current that is fed to the VCO. The integrator therefore functions as a digital to analog converter. The integrating resistor and capacitor used in the integrator circuit set the time constant of the integrator, which is one factor in establishing the tuning and correction rate of the system. In addition, the integrator may support incremental tuning functions by shifting the output voltage/current of the unit an amount proportional to the incremental tuning control input.

The VCO can be any well designed voltage or current controlled oscillator. It is important to have a VCO with a reasonably linear transfer characteristic. The more linear the transfer function, that is, the ratio of change in control voltage or current to the change in frequency of the oscillator, the faster the control loop can be made to respond over the operator range of the oscillator without risk of instability and the incremental tuning rate will be more consistent at various points within the tuning range of the oscillator.

Applicant is aware of the following U.S. Pat. Nos.: 4,041,416; 4,121,170; 4,453,269; 4,921,467; and, 5,542,113. None of the above patents show a system having the advantages of the present invention.

SUMMARY OF THE INVENTION

It is an object of the present invention to provide an improved frequency stabilizer circuit.

It is another object of the present invention to provide a frequency stabilizer control circuit that is simple and efficient to use.

It is another object of the present invention to provide a method and apparatus for controlling and stabilizing oscillators that are simple in construction, economical to manufacture and simple and efficient to use.

There are several major advantages to the system of the invention.

Passive Frequency Stabilization

U.S. Pat. No. 4,014,416 (Glance) accomplishes this by using the thermal expansion of a wave guide to offset impedance changes in the oscillator due to ambient temperature fluctuations.

U.S. Pat. No. 4,453,269 (Skar) utilizes careful circuit layout and shielding to reduce the effects of stray inductance and capacitance on the frequency of the oscillator.

The present invention is an active design, capable of correcting any frequency change within the limits of its control loop. Since many environmental factors can change or "pull" the frequency of the oscillator, passive designs are limited in their effectiveness. Glance compensated for ambient temperature changes, while Skar reduced the effect of stray inductance and capacitance. Other factors, such as component aging, tolerance, and loading are not addressed. By measuring and correcting on frequency, the Present invention groups all environmental factors together and corrects for their net effect.

Frequency Stabilization by Frequency Locked Loop

U.S. Pat. No. 4,121,179 (Hartmann et all) describes a method for comparing the lowest counting unit of a frequency counter to a known value, and steering the control voltage of an oscillator to offset the change in frequency. Provision is made for rapid frequency drifts by changing the time constant of the RC charging network.

In comparison, the present invention corrects on the magnitude of the frequency error not simply on the direction. Furthermore, rather than adjust the time constant for the RC charging network (at the risk of making the control loop unstable), the present invention utilizes a programmable time base frequency counter whose count window is adjusted to match the stability of the oscillator. Thus during warm-up when the drift rate of the oscillator is considerable, the count window of the frequency counter is short and corrections are made often. As the oscillator stabilizes, the count window is expanded and corrections are made more slowly.

Hartmann's design is also limited in that corrections are centered on a desired fixed value in the least significant counting unit, namely 0. The values 9,8,7, or 6 in the least significant counting unit cause a correction in one direction, while the values 1,2,3,4, or 5 cause a correction in the other direction. Deviations outside of this window would cause the loop to lock onto the next window. This effectively tunes the VCO in steps, allowing a deviation of only +/−5 counts before the loop effectively "jumps" to a new center frequency. The Present invention implements continuous tuning by comparing the desired frequency to the measured frequency. Since the full resolution of both registers is maintained in software, the loop never "jumps", and can recover from large disturbances.

U.S. Pat. No. 4,921,467 (Lax) teaches a method for temperature stabilizing a local oscillator by means of a temperature probe and a control voltage. A temperature/control voltage data set is pre-programmed in memory, and revised when unacceptable errors in frequency occur.

U.S. Pat. No. 5,542,113 (Fink, et all) describes a method of stabilizing a carrier frequency locked to a reference oscillator. The measured cycle count is compared to an expected cycle count corresponding to a predetermined carrier frequency to determine a drift error. From the drift error a control signal adjustment to correct drift error is computed and applied to the reference oscillator.

One of the primary advantages of the present invention is that it requires no prior programming to operate on a wide range of voltage controlled oscillators. An external resistor/capacitor determine the response time of the loop and can be adjusted to optimize performance, but no special tools or programming are required.

Both Lax and Fink present narrow band stabilization schemes designed to make incremental adjustments in the frequency of the reference oscillator by means of an applied control voltage. Such systems would require design for a specific application Also, while the above mentioned patents are specifically directed toward stabilization, the present invention can also function as a frequency controller. By incorporating both features, the present invention provides a stable, clean, analog frequency synthesizer with digital tuning features.

Coarse Frequency Acquisition by Frequency Lock Loop

Kianush describes a frequency tuning scheme comprised of two tuning stages, loop one (L1) and loop two (L2). L1 is unrelated in that it deals with analog frequency lock in to a received signal. L2, used for coarse digital frequency acquisition, is comprised of a voltage controller oscillator, variable time base frequency counter, a digitally controlled current source, memory, and a microcontroller.

When the receiver is to be tuned to a new frequency, L2 is activated. The frequency error is measured, and this value is used to determine the window number. The error windows are geometrically spaced, all centered around the desired frequency. Each error window has a fixed current and a time base for the frequency counter associated with it. The current is integrated to a voltage change applied to the VCO by means of a capacitor. Once the frequency error is within the innermost window L2 is deactivated and control is turned over to L1) for locking and fine tuning based on envelop detection.

The present invention control loop has been designed to operate dynamically in both frequency acquisition and stabilization, independent of a received signal. As such, it can be used in a wide variety of applications. Anywhere that frequency and voltage are, or can be, correlated, the concept could be implemented to provide simple, effective digital control.

Frequency Synthesis by Phase Lock Loop

A common method of frequency synthesis/stabilization is the phase lock loop (PLL). The individual patents related to this subject matter will not be addressed individually as they differ substantially from the present invention's frequency lock loop (FLL) concept. Rather, the relative advantages/ disadvantages of the two control loops will be discussed.

The PLL, in its simplest form, is comprised of a stable reference oscillator, a multiply/divide stage, a voltage controlled oscillator (VCO), a phase detector, and low pass filters. The VCO is phase locked to some multiple of the reference oscillator by filtered feedback from the phase comparator. The PLL provides stable frequency synthesis and fast settling times. However, since phase feedback is continuous, ripple is introduced to the VCO. This ripple is reduce by proper filtering, but cannot be eliminated. Also, the reference oscillator is often digitally controlled, with discrete steps between selectable frequencies. These discrete steps are reflected in the VCO, leading to dead zones in the tuning band. Moreover PLLs are still quite complex requiring many discrete components and specific programing.

The control loop of the present invention has a slower settling time than PLL, but provides many other desirable features for applications that are not extremely time critical. It allows continuous tuning, greatly reduces circuit complexity, and eliminates the need for specific programming. Corrections are made only on frequency deviations, and the frequency resolution is automatically extended to maximize VCO stability and reduce noise. Rapid changes in frequency can still be achieved by switching in an offset voltage.

With the above and other objects in view, the present invention consists of the combination and arrangement of parts hereinafter more fully described, illustrated in the accompanying drawings and more particularly pointed out in the appended claims, it being understood that changes may be made in the form, size, proportions and minor details of construction without departing from the spirit or sacrificing any of the advantages of the invention.

BRIEF DESCRIPTION OF THE DRAWING(S)

FIG. 3 is a schematic diagram of the display and control circuit

DESCRIPTION OF THE PREFERRED EMBODIMENT(S)

Figure 1:
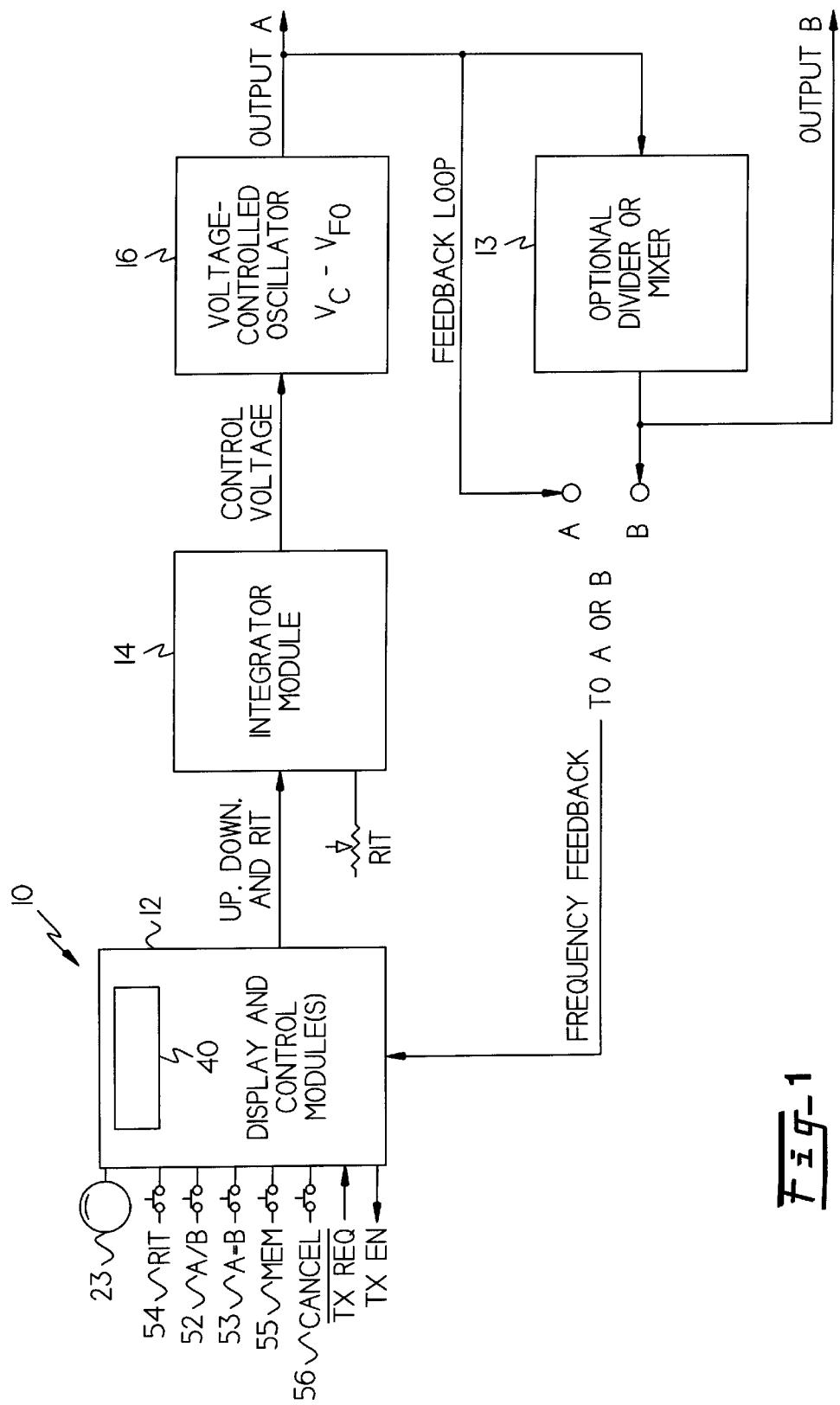
FIG. 1 is a block diagram of the frequency stabilizer according to the invention.
Figures 2, 2A:
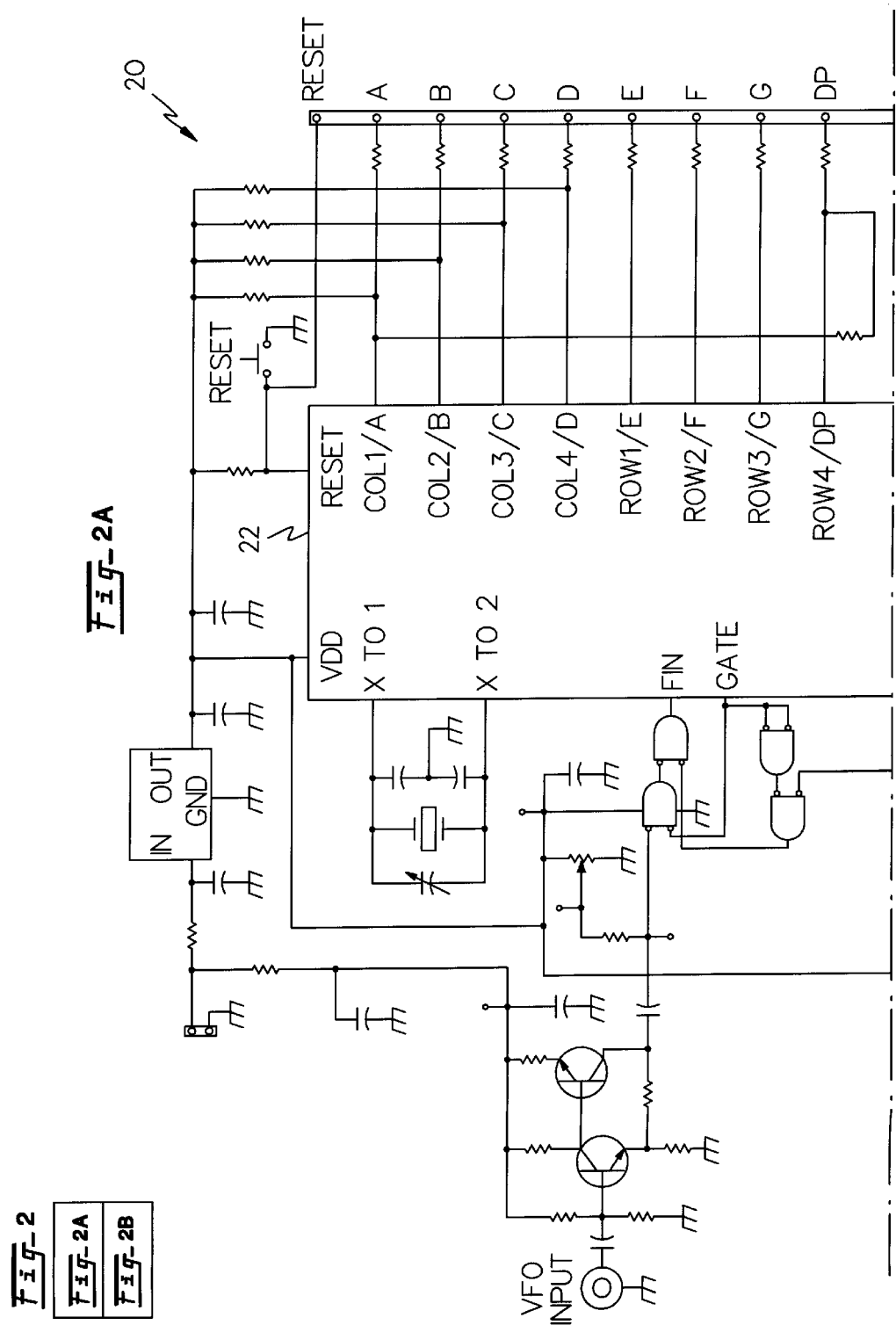
FIG. 2A and 2B are schematic diagrams of the logic circuit.
Figure 2B:
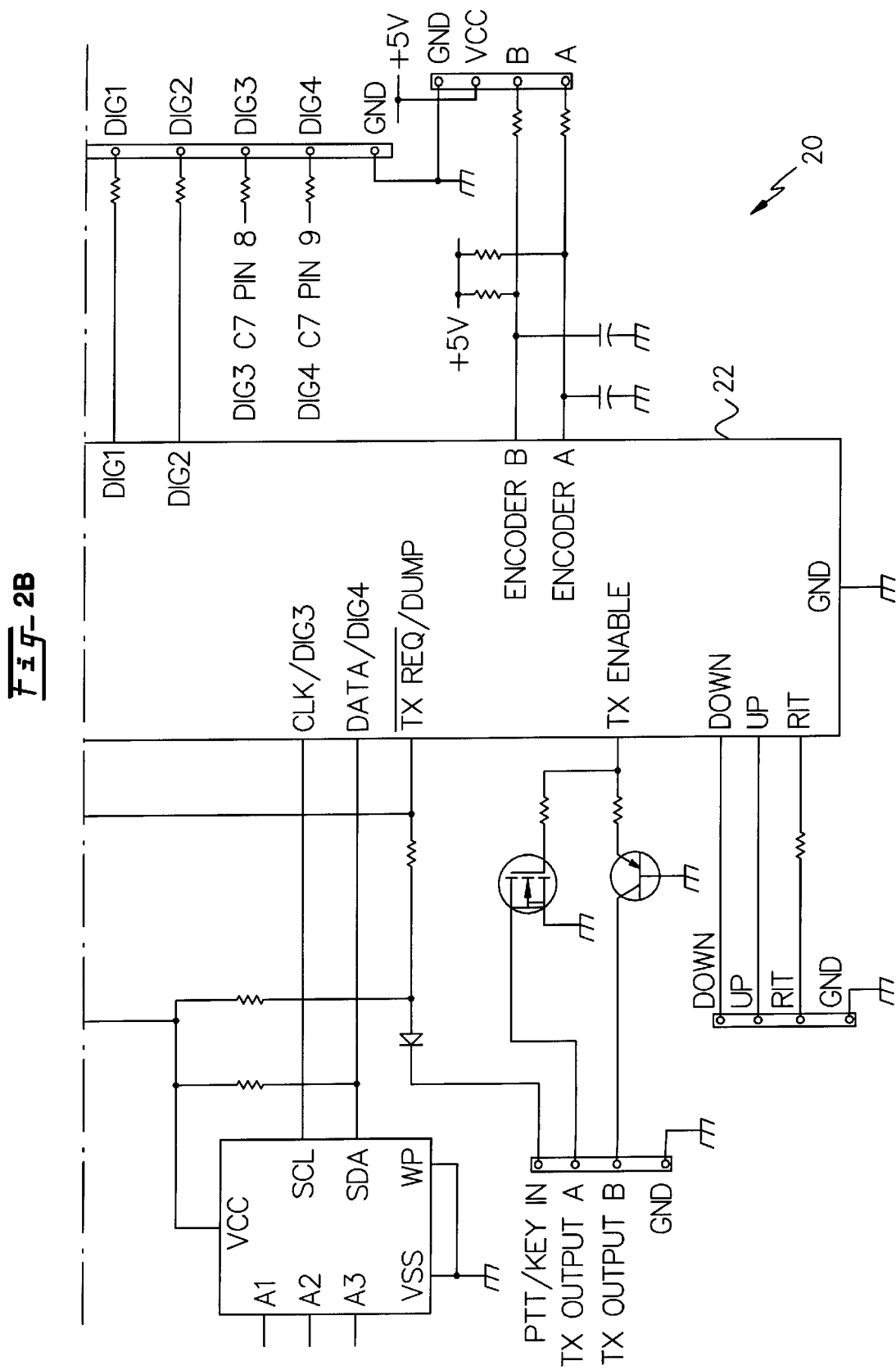

Referring now to FIGS. 1 and 2, a block diagram of the system of the invention, generally indicated by the numeral 10, is shown. As has been previously stated, the system 10 has three primary components; a display and control module 12, an integrator module 14, and a voltage controlled oscillator or VCO 16. A divider or mixer 18 may be included in order to increase the frequency range.

The display and control module 12 allows for operator interface, and includes means for adjusting the target frequency and performing other operations, as well as means for displaying the frequency of the signal and providing an indication of the operational status of the unit.

Figure 8:
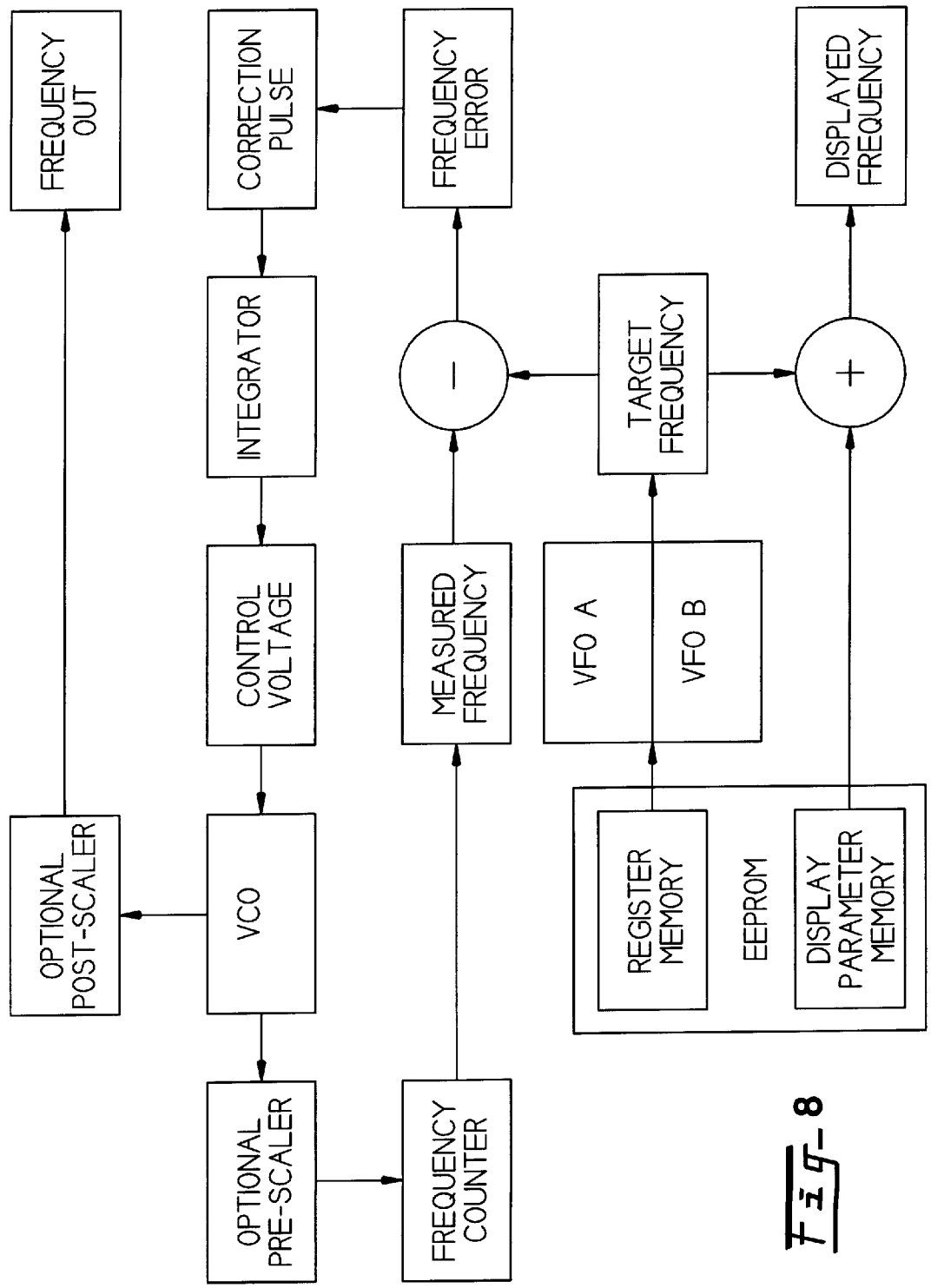
FIG. 8 illustrates the sequence of operations performed in accordance with the system of the invention.

The system 10 translates a desired change in frequency into a change in control voltage. As with all control loops, certain criteria must be met for the loop to remain stable. The input to the system 10 is the measured frequency, and its output is the control voltage. Internally, the system 10 compares the target operating frequency to the measured frequency. The target operating frequency can be input from 32 external memories, internal registers (VFO A and VFO B as shown in FIG. 8), or selected with the shaft encoder. The desired change in frequency (the difference between the target operating frequency and the measured frequency) is translated into a correction pulse with a length of microsecond per 10 Hz desired change in frequency. If the measured frequency is too low, the UP [11] pin of the C7 is pulsed. If the measured frequency is too high, the DOWN [10] pin of the C7 is pulsed. The pulses output by the C7 are applied to the integrator board. The integrator 14 effectively transforms the output pulse length into a change in control voltage.

Details of the display and control module 12 are shown in the schematics of FIGS. 2 and 3. The module 12 includes control logic as well as display driver circuits. The control logic circuit 20 employs a micro-controller chip 22, which may be a C7 programmable frequency counter/controller chip. The power for the display and control module is supplied to connector J3 which is connected through resistors R9 and R10 to the buffer/amplifier circuit comprised of transistors Q1 and Q2 and their respective support components and to voltage regulator U4 which may be a 78M05 regulator chip respectively. The output of voltage regulator U4 is the logic and display supply voltage. In the preferred embodiment, a 5 volt supply voltage is used. It should be noted that the support circuitry must be capable of operating at the voltage supplied to the controller 22 over the operating frequency range. Capacitor C8 is connected between R9 and ground and acts as a filter capacitor. Capacitor C3 also connects between R9 and ground and acts as a high frequency bypass. Capacitor C5 connects to the input of U4 and acts as a filter capacitor. Capacitors C4, C6, and C7 connect to the output of U4. C4 is mounted physically close to the supply voltage pin of U1 and C6 is likewise mounted close to the supply voltage pin of 22, both acting as high frequency bypass capacitors. C7 is an energy storage capacitor.

Resistor R35 connects regulated voltage from the voltage regulator U4 to the controller 22 pin 28. When power is applied to the controller, pin 28 is immediately pulled to the level of the regulated voltage supplied by regulator U4, 5 volts in this case, unless RESET switch, S1, is depressed. A high voltage at pin 28 allows the controller to operate while a low voltage at pin 28 causes the controller to reset and cease operation.

Controller 22 pins 26 and 27 are connected to crystal Y1 which is used to establish the time base for the circuit. A 4.032 MHz crystal is employed, and is connected to feedback capacitors C9 and C10. Crystal Y1 and associated feedback capacitors, C9 and C10 should be located as close as possible to the frequency controller chip 22, and lead lengths should be minimized. Since the crystal time base establishes the accuracy of the frequency counter, some method should be established to adjust the crystal frequency to exactly 4.032 MHz. Variable capacitor C11 provides such adjustment. Crystals calibrated at 18 pf parallel load may be used with the crystal circuit. Capacitors C9, C10 and C11 should be temperature stable units like COG or NPO.

VCO 16 input J1 is connected to the input of the controller chip 22 through the buffer/amplifier circuit and the gate U1. The buffer/amplifier is comprised of transistors Q1 and Q2 and their associated bias and gain setting resistors and coupling capacitors. C1 is a DC blocking capacitor connected between the VCO 16 input and the base of Q1. R1 and R2 form a voltage divider between the supply voltage and ground and connect to the base of Q1 and provide base bias for Q1. R4, connected to supply voltage and collector of Q1 provides collector bias and R3 connected to the emitter of Q1 provides emitter bias and forms part of the gain setting circuit. Amplified VCO 16 signal is coupled directly from the collector of Q1 to the base of Q2. R3 is connected to the emitter of Q2 and provides emitter bias. R6 connects between the collector of Q2 and the emitter of Q1 and provides collector bias for Q2 and forms part of the gain setting circuit along with R3. Capacitor C2 connects between collector of Q2 and pin 2 of gate U1A and acts as signal coupling and DC blocking capacitor. Gate U1 obtains its operating voltage from a connection from pin 14 to the output of voltage regulator U4. U1 pin 2 is connected to resistor R7 which in turn is connected to the movable wiper of potentiometer R8 which in turn is connected between the output of voltage regulator U4 and ground. The combination of R7 and R8 form a variable voltage divider having the purpose of biasing gate U1 to its most sensitive operating point The operation of the controller chip 22 requires a gating arrangement such that the frequency to be measured is applied to pin 13 when GATE, pin 7 is low and pulses from the DUMP output, pin 15, can be applied to pin 13 when pin 7 is high. The arrangement of U1A, U1B, U1C and U1D is one way to accomplish the required gating. The high to low transitions of the pulse train at pin 15 are accumulated in an internal register while GATE, pin 7, is low.

Set-up and operating data is stored in non-volatile memory chip U3. Power for the chip is provided by the voltage regulator U4 and is connected to the chip at pin 8. Pin 5, serial data, is connected to the controller 22, pin 9. Said data line is also connected to resistor R13, the other end of which connects to regulated voltage. Pin, 6, clock, is connected to the controller 22, pin 8.

Transmit request (PTT or Key) at connector J2 is connected to blocking diode D1 which in turn is connected to resistor R11, a pull up resistor, and R12, and isolation resistor. R12 in turn connects to the TX Req input (pin 15) to 22. TX Enable, pin 16, goes high when the controller 22 is in transmit mode. Resistor R36 connects this signal to the gate of transistor Q3. The drain terminal of Q3 connects to TX output A at J2. This output is used for keying transmitting equipment having a positive keying voltage. Resistor R37 connects this signal to the emitter of transistor Q4. The base of Q4 connects to ground and the collector of Q4 connects to TX output B at J2. This output is used for keying transmitting equipment having a negative keying voltage. R37 sets the maximum current available at the TX output B terminal at J2.

Integrator 14 (FIG. 4) connections are made at J4. Integrator 14 UP command is connected from J4 directly to controller 22 pin 10. Integrator 14 DOWN command is connected from J4 directly to controller 22 pin 11. Receive incremental tuning (RIT) is connected from J4 to controller 22 pin 17 through a current limiting resistor R38.

The tuning shaft encoder 23 is connected to the controller 22 via connector J6. Power is provided to the encoder from the voltage regulator U4 via J6. The controller 22 requires encoders having quadrature outputs. Encoder A output is connected to controller 22 pin 12 through resistor R32. Encoder B output is connected to controller 22 pin 13 through resistor R31. If Encoder A leads Encoder B by 90 degrees, clockwise rotation is assumed. If Encoder B leads Encoder A by 90 degrees, counterclockwise rotation is assumed. The specific input buffer requirements will depend on the device being used. The number of transitions per revolution should be in the range of 24 to 128. Values less than 24 transitions per revolution are noticeably sluggish. Values greater than 128 transitions per revolution may cause the C7 to alias when the encoder 23 is spun rapidly. Resistors R33 and R34 connect to controller 22 pins 12 and 13 respectively and can provide weak pull-up current for encoders 23 having switch contact or open collector type output Capacitors C12 and C13 connect to controller 22 pins 12 and 13 respectively and along with resistors R31 and R32 provide high frequency bypassing to prevent false tuning signals appearing at the controller input pins.

The frequency to be measured is applied to pin 1 of the C7 (controller 22).

Connection to the LED displays and operator switches is accomplished via connector J5. Resistors R27, R28, R29 and R30 connect to controller 22 pins 14, 6, 8 and 9 respectively. The other end of each resistor connects via J1 on FIG. 3 to the gate of transistors Q1, Q2, Q3 and Q4 respectively on the display and switch assembly indicated in FIG. 3. The resistors R27 through R30 provide current limiting for the output drivers of controller 22. Resistors R18, R19, R20, R21, R22, R23, R24 and R25 connect to controller 22 pins 25, 24, 23, 22, 21, 20, 19 and 18 respectively. The other end of each resistor connects via J1 on FIG. 3 to the LED segments a, b, c, d, e, f, g and dp, respectively. The resistors R18 through R25 provide current limiting for the output drivers of controller 22 and also provide limited low pass filtering, minimizing noise generation during display scanning. Resistor R26 connects between controller 22 pins 18 and 25 and places the controller chip into the automatic arming mode. If the VCO error is greater than 20 hz and RIT is selected, the control loop unlocks and allows the frequency to change. This permits RIT adjustments to change the VCO. Resistors R14, R15, R16 and R17 connect between regulated voltage from voltage regulator U4 and controller 22 pins 25, 24, 23 and 22 respectively. These resistors provide weak pull-up currents used by the operator switch matrix indicated on FIG. 3.

DC blocking input capacitor C1 is connected to a voltage divider which includes resistors R1 and R2. The voltage divider is connected to the base of transistor Q1, which has its collector connected to the base of transistor Q2. Biasing resistors R3–R6 complete the amplifier circuit which has its output connected to capacitor C2. A biasing circuit including resistor R7 and variable resistor R8 is connected to the logic gate arrangement.

Pin 8 is connected to an external EEPROM U3 and provides a clock signal thereto. Pin 9 is a bi-directional data line for U3. Pin 15 is a dual purpose output/input. When functioning as an output, DUMP, this pin generates from 1 to 256 pulses to the input gating logic in order to read the contents of the internal, high-speed prescaler. As an active low input, TX REQ, pin 15 is used to receive request transmit signal from, e.g. a transceiver. When TX REQ transitions from high (receive) to low (transmit), the following sequence takes place:
1) TX ENABLE [pin 16] is set and RIT ENABLE [pin 17] is cleared not more than 5 ms later.
2) The receive frequency is stored.
3) The transmit frequency is measured.
4) The C7 corrects for drifts in the transmit frequency.

When TX REQ transitions from low (transmit) to high (receive), the following sequence takes place:
1) TX ENABLE is cleared and RIT ENABLE is set (if RIT is selected) not more than 5 ms later.
2) The receive frequency is restored (unless the shaft encoder was used to change the frequency during transmit).
3) The C7 corrects for drifts in the receive frequency.

Diodes D1 and D2 provide over and under voltage protection. Resistors R12 and R11 provide current limiting and weak pull up for the input, respectively. As shown, this pin is designed to be used for PTT and/or KEY functions.

Referring to FIG. 3, a schematic of the display and control circuit will now be described. Resistors R40, R50, R60, and R70 connect from the gates of transistors Q100, Q200, Q300, and Q400 respectively and provide gate bias for those transistors. Transistors Q100 through Q400 are each connected to seven segment common cathode numeric display LED's 40. The drain connection of each transistor connects to the cathode of its respective display, U20 through U40. Segment drive from the controller 22 is simultaneously connected to segments a through dp of each display (parallel connection). The controller 22 rapidly and sequentially raises one of the gate drive signals at a time, resulting in the transistor, Q100 through Q400, connected to the high gate line to switch on, lowering the cathode of the display to which it is attached. At the same time controller 22 raises segment lines appropriate for the display digit selected, resulting in each of the displays being illuminated approximately 25% of the time. For a very brief period during that time all driver transistors are turned off and the switch matrix comprised of switches S2, S3 S4, S5, S6, S7, S8 and S9 is scanned and the results stored in an internal register of the controller 22. The switches S2 through S9 are connected to the controller 22 in rows and columns. One terminal of switches S2, S5 and S7 connect to controller 22 pin 24 and the other terminal of switches S2, S5 and S7 connect to controller 22 pins 21, 20 and 19 respectively through a current limiting resistor R310, R210, and R110, respectively. One terminal of switches S3, S6 and S8 connect to controller 22 pin 23 and the other terminal of switches S3, S6 and S8 connect to controller 22 pins 21, 20 and 19 respectively through a current limiting resistor R310, R210 and R110 respectively. One terminal of switches S4 and S9 connect to controller 22 pin 22 and the other terminal of switches S4 and S9 connect to controller 22 pins 21, 20 and 19 respectively through a current limiting resistor R310, R210 and R110 respectively.

The decimal point (dp) segment 42 of each of the LED displays U10, U20, U30, and U40 shown in FIG. 3, act as annunciator lights. The dp segments 42 are located in the lower right corner of each display digit 40.

Figure 4:
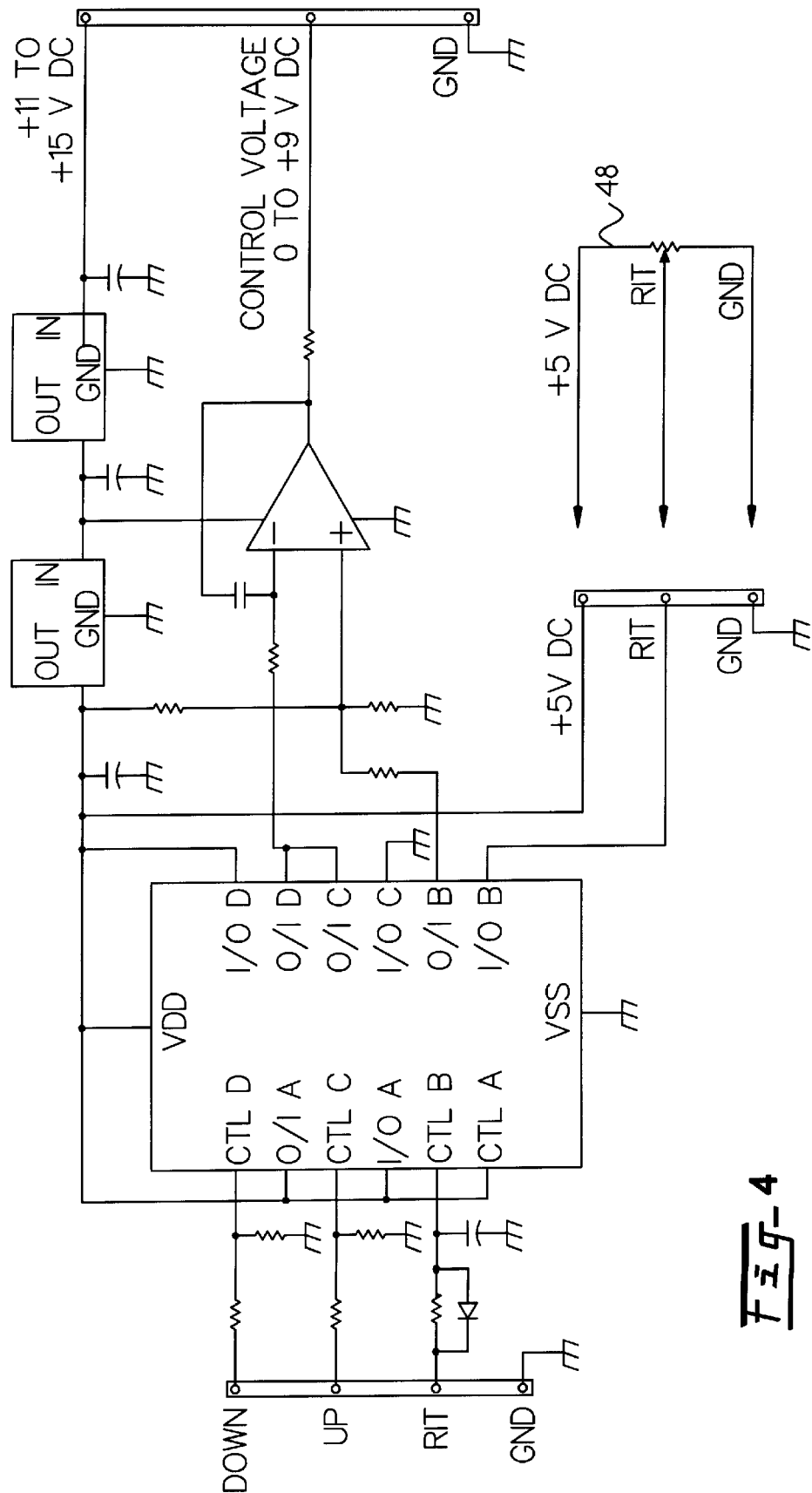
FIG. 4 is a schematic diagram of the integrator circuit

The integrator 14, shown in FIG. 4, converts control pulses from the control unit 12 to a DC control voltage/ current that is fed to the VCO 16. The integrator 14 therefore functions as a digital to analog converter. The integrating resistor and capacitor used in the integrator circuit set the time constant of the integrator 14, which is one factor in establishing the tuning and correction rate of the system 10. In addition, the integrator 14 may support incremental tuning functions by shifting the output voltage/current of the unit an amount proportional to the incremental tuning control input.

Details of the integrator module 14 are shown in the schematic of FIG. 4. Unregulated DC power is applied to the module 14 via J2. The unregulated voltage is connected to the input of voltage regulator chip U33. Capacitor C33 is connected from the input of U33 to ground to prevent the possibility of high frequency oscillations of U33. The output of U33 connects to the input of voltage regulator chip U2 and to the positive power supply pin, pin 7, of the operational amplifier U11. Capacitor C44 is connected from the input of U2 to ground to prevent the possibility of high frequency oscillations of U2. The output of regulator chip U2 supplies regulated operating voltage to the CMOS analog switch U11, to the receive incremental tuning (RIT) potentiometer 48 (if used) and to the voltage divider consisting of resistors R77 and R88. Capacitor C55 connects to the output of voltage regulator U2 and provides high frequency bypass. Up, Down and RIT signals from the controller 22 are connected to the integrator 14 via connections at J1. The DOWN pulses are connected to the control input D of CMOS analog switch U44 through current limiting resistor R49. Resistor R33, connected to the control input D of switch U44 provides a logic 0 at that input when the integrator module 14 is disconnected from the controller module 22. The UP pulses are connected to the control input C of CMOS analog switch U44 through current limiting resistor R27. Resistor R44, connected to the control input C of CMOS analog switch U44 provides a logic 0 at that input when the integrator module 14 is disconnected from the controller module 22. RIT control signal is connected to the control input B of CMOS analog switch U44 through timing resistor R55. Capacitor C22, connected to control input B, in conjunction with resistor R55, forms a time delay circuit when the controller 22, raises the RIT signal pin to logic 1. When the controller 22 lowers the RIT signal pin to logic 0, diode D1 connected parallel to resistor R55 provides a low impedance path to quickly discharge capacitor C22. The result is a time delay on, nearly instant off circuit.

I/O D, pin 11 of the analog switch U44, is connected to regulated voltage supplied by U2. O/I D, pin 10 of the analog switch U44 is connected to O/I C, pin 9 of U44. I/0 C, pin 8 is connected to ground. Operational amplifier U11 and associated components, R66, R77, R88, R99 and C25, form an integrator which is used to convert the short duration UP/DOWN pulses to and a variable voltage RIT signal to a smooth and stable DC variable voltage to control a voltage variable oscillator (VCO or VCO 16). Resistor voltage divider composed of resistors R77 and R88 provide reference voltage which is equal to approximately one half the value of the regulated voltage from U2 for the operational amplifier U11. Resistor R99 connects between pins 8 and 9 of analog switch U44 and inverting input, pin 2, of operational amplifier U11. Capacitor C25 connects between inverting input, pin 2, of operational amplifier U11 and its output, pin 6. Control voltage to the VCO 16 is taken from operational amplifier output, pin 6, and connected to current limiting resistor R29 which in turn is connected to the Control Voltage terminal of J2. Receive incremental tuning (RIT) potentiometer, 48, is connected between regulated voltage delivered by regulator U2 and ground via J3. The wiper of R111 connects to analog switch U44 I/O B, pin 4. 0/I B, pin 3 connects to the junction of voltage divider resistors R77 and R88 through resistor R66. This circuit provides a means of adjusting the reference voltage and hence the output voltage of integrator U11 when RIT pin of controller 22 is driven high. When RIT pin of controller 22 is drive low, this circuit has no effect on voltage divider R77 and R88 and is prevented from adjusting the reference voltage.

Referencing the integrator schematic we obtain an equation for the change in control voltage:
Equation 1.0

$$\Delta V_{cv} = (-\Delta ER_{99} * k * \Delta F)(R_{99} * C25)$$

Where:

$\Delta V_{cv}$ is the change in the control voltage, k is the correction pulse length per Hz desired frequency change, (This a built in constant of the C7:1 $\mu$s pulse/10 Hz desired change), $ER_{99}$ is the voltage across R99 $\Delta F$ is the desired frequency change in Hz, R99 is the integrator resistor in meg ohms.

C25 is the integrator capacitor in micro farads.

The direction of the change in the control voltage is determined by the UP and DOWN lines on J4 of the main board The UP and DOWN lines are used to switch 0 and +5 VDC, respectively, to resistor R99. Since the non-inverting input is kept at approximately 2.5 VDC, ER99 is roughly 2.5 volts when the DOWN line is asserted, and −2.5 volts when the UP line is asserted. The integrator capacitor, C25 is $\mu$F. Substituting these values results in the following simplification:
Equation 1.1
Where:

$$R9 = 0.25 * (\Delta E/\Delta V) MAX$$

($\Delta E/\Delta V$) MAX is the maximum slope of the frequency vs. control voltage plot of the VCO in Wiz/Volt.

For optimal speed, the desired frequency change should be the same as the actual frequency change. However, the loop will remain stable as long as the actual frequency change is not more than twice the desired frequency change. After this point, the control loop will cause the VCO to oscillate because "corrections" will only serve to increase the frequency error. For example, if the measured frequency is 100 Hz below the target frequency, the C7 will output a pulse 10 microseconds long on the UP line. Let's say that this pulse causes the VCO to go up in frequency 250 Hz. Now the measured frequency will be 150 Hz above the target frequency. The C7 will now output a pulse 15 microseconds long on the DOWN line, causing the frequency to drop 375 Hz. As you can readily see, we are not "homing in" on the target frequency but rather, the oscillations are growing. If the system 10 causes the VCO 16 to oscillate, R99 should be increased.

Turning now to the resolution of the correction pulses, if each correction pulse causes a minimum change of 10 Hz, it may be possible to hear the corrections in a quiet receiver. From the view point of the listener, it would be preferable if the correction pulses were too small to detect. This can be accomplished by increasing the integrator resistor, R99. If the resistor R99 is too large, the control loop is so slow that it is unable to counteract the drift of the oscillator, and the frequency will drift until the length of the correction pulses exactly corrects for the drift The system 10 will not oscillate, but the actual frequency will be slightly above or below the desired frequency, depending on the predominate drift. Also, seek times (when switching target frequencies) will be very long. If this occurs, the value of R99 should be decreased.

Thus, for stability:

$$0.125 * (\Delta F/\Delta V) MAX < R99 < \infty$$

A compromise between speed, resolution, and overall "feel" may be obtained:
Equation 1.2

$$R99 = (\Delta F/\Delta V) MAX.$$

The system 10 continues to work well using a resistor four times as small (better speed response when switching frequencies), or four times as large (smoother feel). If no information is available on the frequency vs control voltage for a particular VCO 16 the system 10 has a built in frequency counter mode in which the shaft encoder 23 can be used to change the control voltage. This feature allows the user to measure as many frequency-voltage points as you wish, plot them, and find the maximum slope of the VCO 16 without an external frequency counter or pot. All that is needed is a volt meter to measure the control voltage. For most purposes, five to fifteen evenly spaced points should be adequate. In general, the more linear the transfer function, the fewer points required. If the system 10 is to be used on more than one VCO 16, choose R99 so that the control loop is stable for the most sensitive VCO 16. The RIT range is established by resistor R66 on the integrator board. When the wiper of the RIT pot is grounded, R66 is in parallel with R88. When the wiper is connected to +5VDC, R66 is in parallel with R77. The range of voltage change (in volts) on the non-inverting input of the op-amp is then:

$$\Delta V = 25/(5 + R66) R66 \text{ in kohms.}$$

This change is centered around 2.5 volts. To avoid biasing the input pulses significantly, R66 should be at least 20K The change in voltage on the noninverting input is directly reflected on the control voltage output. Once the average slope of the frequency v voltage plot is known, the RIT range can be easily calculated:
Equation 1.3

$$R66 = ((\Delta F/\Delta V) AVG * 25)/\Delta FRIT + 5.$$

Where:

FRIT is the desired RIT range in kHz and ($\Delta F/\Delta V$)AVG is the average slope of the frequency v. voltage plot in kHz per volt. It should be noted that if the integrator 14 its saturated (i.e. at the high end or low end of its voltage range) the RIT pot will not have any further effect in the direct of saturation.

The VCO 16 can be any well designed voltage or current controlled oscillator. it is important to have a VCO 16 with a reasonably linear transfer characteristic. The more linear the transfer function, that is, the ratio of change in control voltage or current to the change in frequency of the oscillator, the faster the control loop can be made to respond over the operator range of the oscillator without risk of instability and the incremental tuning rate will be more consistent at various points within the tuning range of the oscillator.

If the VCO 16 output frequency exceeds 50 MHZ, a frequency divider or mixing circuit 18 can be inserted into the feedback loop at the location indicated in FIG. 1. The primary function of the divider/mixer 18 is to bring the feedback frequency into range of the C7 circuit chip, but it can be used for other functions. For example, you can increase the tuning (and correction) rate by an amount equal to the division ratio. When connected as shown in the FIG. 1, a times-four prescaler changes the tuning resolution to +40 Hz (+10 Hz.4). To obtain a high resolution 5.0 to 5.5-MHZ VCO 16, the VCO 16 can be operated at 40 to 44 MHZ. Connecting the VCO 16 output directly to the controller 22 input, obtains +10 Hz resolution at the 40 MHZ point. Dividing the VCO 16 output by 8 yields 5.0 to 5.5 MHZ with +1.25 Hz resolution. In addition, the division process reduces the phase noise of the 40 MHZ oscillator by approximately 18 dB.

Basically, the system 10 emulates a frequency locked loop with a number of useful extensions. A VCO 16 frequency is read by the frequency counter and is compared to a previously stored target frequency. If a difference exists between the two, a steering command is used to the VCO 16 to drive the oscillator in a direction that eventually matches the target frequency. If you turn the shaft encoder 23, the system 10 drives the VCO 16 in a direction determined by the shaft encoder 23. The rate of frequency change is determined by the encoders 23 rotation.

Figure 5:
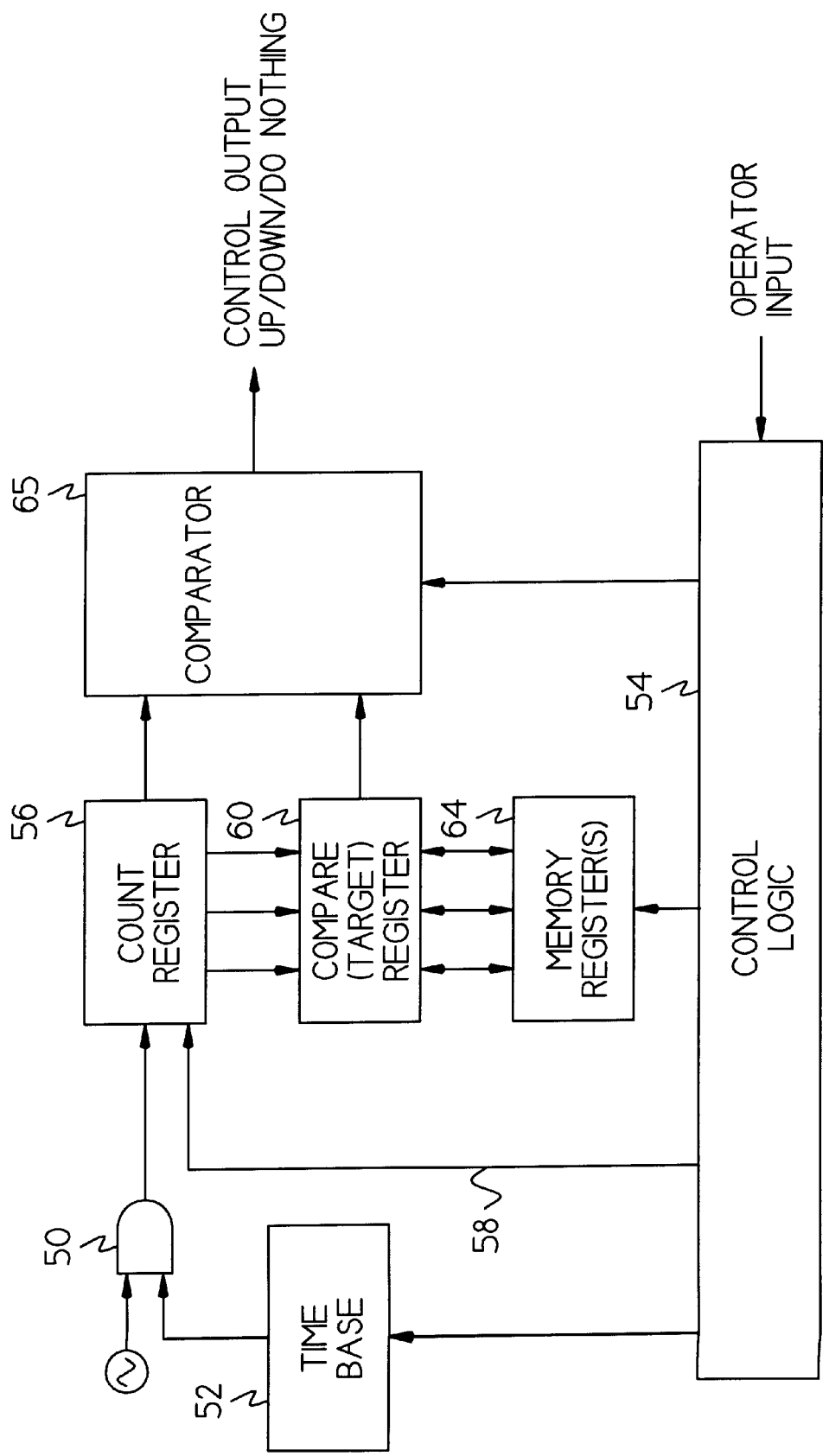
FIG. 5 is a block diagram of the controller chip used in FIG. 2.
Figure 6:
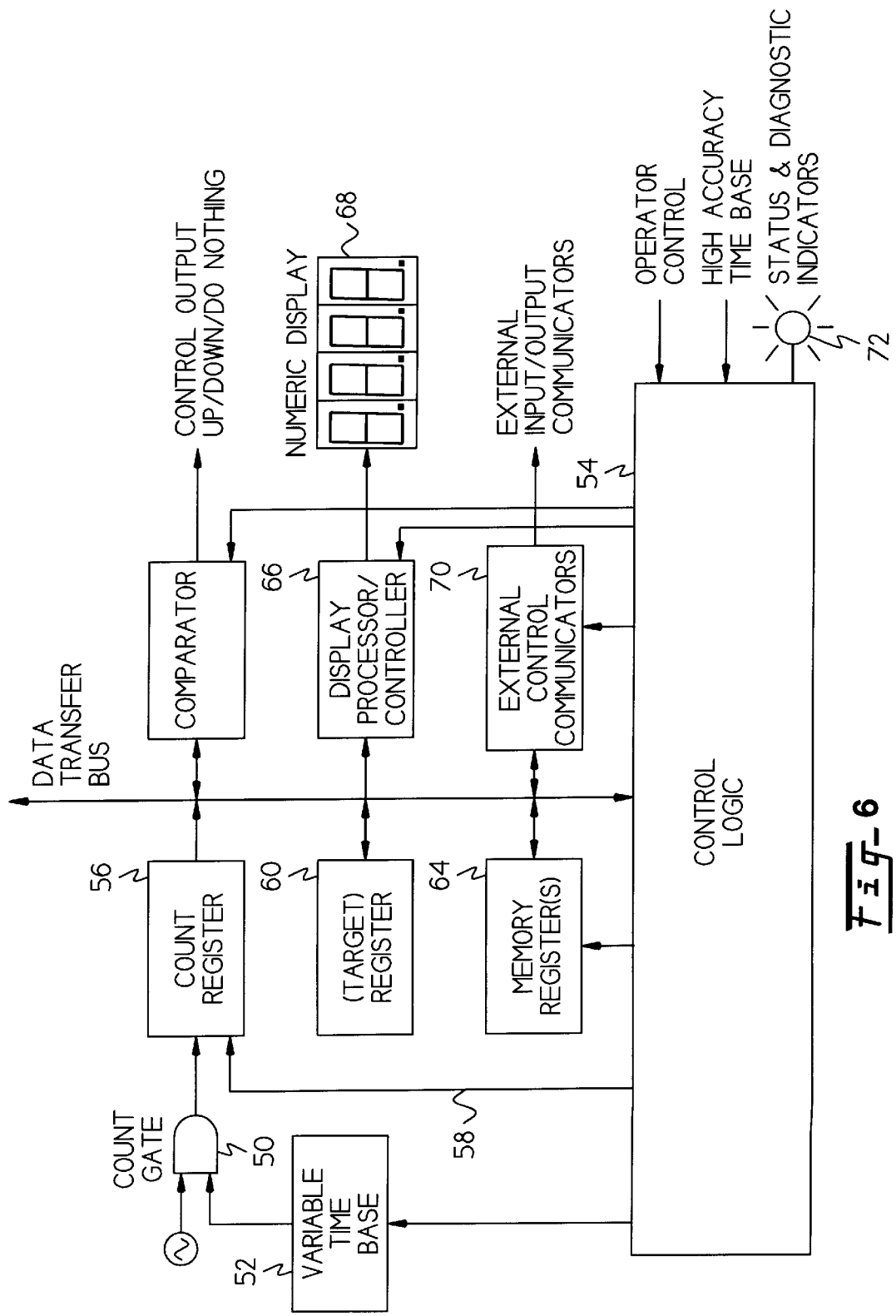
FIG. 6 is an expanded block diagram of the controller chip detailing additional functional modules.

Block diagrams, FIGS. 5 and 6, show a functional diagram of the C7 frequency counter/controller chip. The C7 chip is based on the Microchip Technology, Inc. 16C57 series programmable microcontrollers. Other programmable microcontrollers, microprocessors or computers could also be used if appropriate features were provided in their design. The functions performed by each block are done through a combination of programmable hardware and program instructions stored in program memory.

The block diagram shown in FIG. 5 is a subset of the diagram shown in FIG. 6, so some of the elements are common to both diagrams. The frequency to be measured is connected to one input of a count gate 50 which also is connected to a variable time base 52. The variable time base 52 in turn is connected to the control logic module 54 which determines the time base period (or count time window as described in a subsequent section referring to FIG. 7). Output from the count gate 50 is applied to the count register 56 and a control line 58 connects the count register 56 to the control logic 54. The elements work together in the following way. The control logic 54 sends a clear command to the count register 56 to prepare it to receive a new count [count being the number of cycles present in a given period of time in the frequency being measured and controlled]. The control logic 54 then sets the variable time base 52 to an appropriate value which in turn opens the count gate 50 allowing each cycle of the frequency being measured and controlled to be accumulated in the count register 56 After the variable time base 52 period has expired, the count register value is compared to a count value held in the compare [target] register 60. The result of that comparison is referred to as frequency error. Frequency error is used to establish a new count time window and to control the nature and duration of frequency corrections, as will be described more fully later.

Memory registers 64 hold various target frequencies and other operating information.

Upon command by the control logic element 54, a certain frequency value contained in those registers will be transferred to the target register 66. The effect of this action is to establish a new target value which in turn establishes a new operating frequency for the system 10.

Elements in FIG. 6 not contained in FIG. 5 include display processor/controller 66, numeric display 68, external control communications 70, external input/output communications, high accuracy time base and status and diagnostic indicators 72. The display processor/controller 66 is connected to the control logic 54 via the internal data transfer bus and control lines and also to the external numeric display 68, one example of such connection being described by the schematic of FIGS. 2 and 3. The display processor/controller 66 converts internally stored numeric values to the signals required by the numeric display 68. These numeric values include measured frequency, target frequency plus or minus an offset value, memory channel number and display parameter memory channel. External control communications 70 provides a means to store and access various control data externally using external input and output communications. In the present application, external I/0 is accomplished with a two wire arrangement, one wire being clock and the second being bidirectional data.

Referring briefly to FIG. 2, U3 is an example of the use of an external EEPROM to store target frequencies, offset parameters status of RIT and VFO registers and display mode for instant retrieval. Other arrangements are possible and are considered within the spirit and scope of the present invention. Operator controls include switches for selecting various operating parameters and are shown in FIG. 3 and a rotary shaft encoder 23 for selecting operating frequency, memory channel, display parameter memory channel, frequency offset and display mode. Status and diagnostic indicators are comprised of up to 4 LED's 40 connected to the control logic 54 as shown in FIG. 3. The LED's 40 used there are designated as "dp". In standard indicator mode the status and diagnostic indicators display VFO A register selected, VFO B register selected, RIT enabled for current VFO register and RIT armed for the current VFO 16 register. In diagnostic indicator mode the status and diagnostic indicators display UP pulses being sent, DOWN pulses being sent and control loop out of lock.

Figure 7:
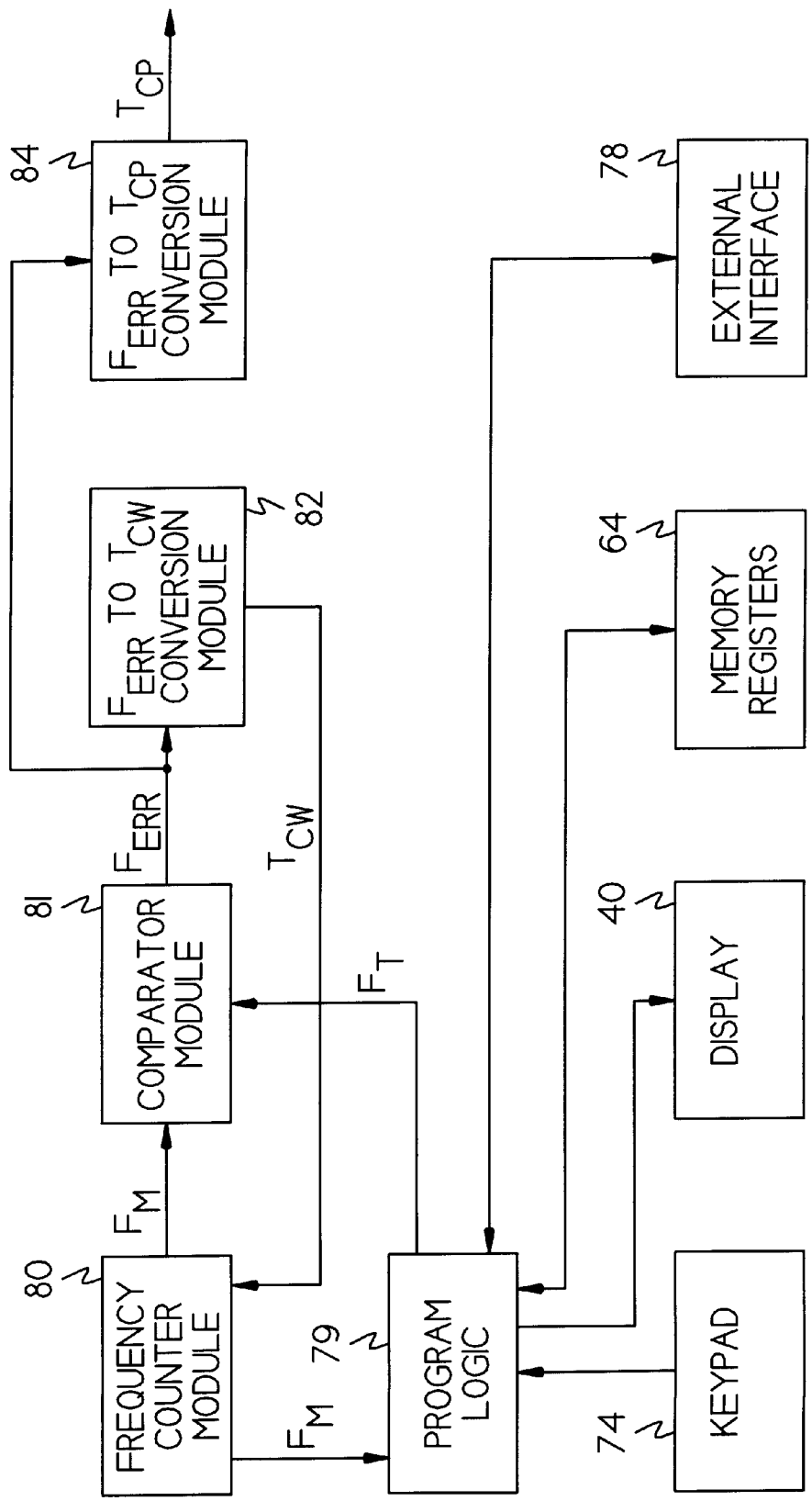
FIG. 7 is a functional block diagram of the system of FIG. 1 illustrating the interrelationship of the various functions performed by the system.

The block diagram of FIG. 7 expands the previous block diagram to include the remainder of elements found in a complete frequency control loop. Some of the elements have been described in previous paragraphs, namely, keypad (operator switches), display (numeric display) 40, 42, memory registers 64, external interface 78 (external communication and program logic (control logic 54).

The $F_{err}$ to $T_{cw}$ Conversion Module can be thought of essentially as a transfer function. The only input to the module is the frequency error, and the only output is the count window time. Logically, if the frequency error is zero, there is no information to correct the frequency, and the count window time must be increased to obtain greater resolution. On the other hand, if the frequency error is large the goal is to minimize the measurement time and maximize the correction time. For example, if the frequency error were 100,000 Hertz, it would require one second to measure this error to 1 Hertz resolution. Since the slope of the VCO voltage/frequency plot may very 100% or more the 1 Hertz precision obtained is insignificant In the current design $T_{cw}$ varies as $3.125*2^n$ ms where n=(0,1,2,3,4).

If $F_{err}$=0 and n<4 then n=n+1

If $F_{err}$>16 then n=0

The $F_{err}$ to $T_{cp}$ Conversion Module may also be thought of as a transfer function. The only input to the module is the frequency error and the only output is the time length of the correction pulse ($T_{cp}$). In order to ensure the stability of the loop, $T_{cp}$ must not cause a frequency change in the VCO>$2*F_{err}$.

In the current design, the transfer function is a straight line with a slope of 1 $\mu$s per Hertz.

$$T_{cp}=F_{err}*1\mu s/Hz*1s/100,000\mu s$$

The frequency counter module measures the external frequency, and is designed to have three inputs and one output. The inputs are the external frequency input (Finp), the counter window time ($T_{cw}$) and the measurement uncertainty ($M_{unvc}$) The output is the measured frequency (F). The following equation is used to calculate $F_m$:

$$F_m=(Finp+M_{uncv})/T_{cw}$$

By allowing the frequency counter module to operate with a variable count window time, the response time for the loop can be altered. However, as the above equations illustrate, the uncertainty associated with each measurement is inversely related to the count window time. When the uncertainty associated with a frequency measurement is larger than the frequency error, no corrections can be made. Ideally, the frequency counter module would allow any input frequency, have zero measurement uncertainty, and allow any count tine window.

The current hardware/software design has the following characteristics:

Finp=0 to 50 MHZ $M_{uncv}$ =+/−1

MCW=$3.125*2^n$ ms where n=(0,1,2,3,4)

The comparator module calculates the difference between the measured frequency and the target frequency, and has been designed with two inputs and one output. The inputs are measured frequency ($F_{err}$), and the target frequency (Fe). The output is the frequency error ($F_{err}$). Since the Fm has an uncertainty term associated with it, $F_{err}$ must be calculated using the following equations:

$$Fdiff = Fm'mean - F_t$$

$$|F_{err}| = |Fdiff| - |F_{m'unc}|$$

If the magnitude of $F_{err}$<0 then $F_{err}$=0. Else:

$$F_{err}=|F_{err}|*Fdiff/|Fdiff|$$

Under the direction of the program logic element 79 the frequency counter module 80, comparator module 81, F err to T cw conversion module 82 and the F err to T cp conversion module 84 operate as follows.

After determination of the correction pulse width, the program logic 79 determines if the pulse is to be applied to the UP or the DOWN output pin and routes it accordingly. From there the pulses are connected to the integrator 14. If UP or DOWN pulses are received by the integrator 14, its output voltage will change in a direction and with such amplitude to drive the VCO 16 to a new frequency closer to the target frequency. The system then makes another frequency measurement and the process continues until the measured frequency is within an acceptable error window, at which time UP or DOWN pulse transmission is inhibited. When the operator turns the shaft encoder 23 requesting a new operating frequency, UP or DOWN pulses appropriate to the direction of frequency change are sent to the integrator 14. The width of the UP or DOWN pulses is determined by the rate at which the shaft encoder 23 is being turned. The result is a variable rate manual frequency change system. During the time the shaft encoder 23 is being turned, the frequency counter module 80 continues to measure operating frequency but the system does not compute F err (error frequency), T cw (count window time) or T cp (correction pulse time). The loop effectively becomes unlocked. When the shaft encoder 23 is no longer being turned, the next measured frequency becomes the new target frequency and operation of the comparator module 81, F err to T cw conversion module 82 and F err to T ep conversion module 84 resumes. When the operator requests receive incremental tuning (RIT) a similar action follows except the input tuning device is not the shaft encoder 23 but another device, like a potentiometer, which applies an offset voltage to the voltage controlled oscillator 16. One method to apply such offset voltage is to insert it at a summing point between the integrator and the VCO 16 (not shown). If the tuning rate of the RIT is greater than some established minimum (20 hz per frequency measurement cycle in the present configuration) and if RIT is selected by switch S4 and ARM has not timed out (it will not ever time out if resistor R26 is connected as shown in FIG. 2), the control loop becomes unlocked. When the RIT tuning rate is less than the established minimum tuning rate, the loop locks and corrects for any frequency error caused by the offset voltage.

VCO 16 is connected to the gate arrangement 50 which allows the signal to be passed to the count register 56 only when commanded by the control/logic unit 54 and for a time period established by the variable time base 52. The period during which the gate 50 is open to allow the signal to pass establishes the control resolution. The control resolution is 10 Hertz, with 0.01 second gate time the resolution is 100 Hertz, and so on. The variable time basis is controlled by the control/ logical unit and the amount of time the gate is open is determined by the task at hand. Prior to opening the count gate, the control/logical unit resets the count register to zero.

On first time start-up, the controller 22 will read start-up memory register 64. If it finds a pre-established pattern, the control/logic unit 54 may, optionally, command the count register 56 to transfer the frequency count to the target register 66. If the controller 22 does not find the pre-established pattern in start-up memory registers 64, it will load the values found in start-up memory registers into the target register 66 and command the comparator 65 to determine if the measured frequency is less than, equal to, or greater than the target frequency. If the measured frequency is less than the target frequency, the comparator 65 sends a "steer up" command to the VCO 16. If the measured frequency is equal to the target frequency, the comparator 65 does not send a commend to the VCO 16. If the measured frequency is greater than the target frequency, the comparator sends a "steer down" command to the VCO 16.

After sending the steering command, which is a pulse, or series of pulses, of fixed or variable duration, the control/ logic unit resets the count register 56, opens the count gate 50 for an appropriate amount of time and acquires a new count which represents the new VCO 16 frequency. This new count is compared to the target frequency in a fashion exactly like that just described.

Eventually, a condition may be found where the frequency of the VCO 16 is equal to the target frequency. At this point, the system is said to be "locked", but will continue to read, compare the measured frequency with the target frequency and control the VCO 16 frequency as described. FIG. 8 illustrates graphically the foregoing sequence of events.

Under certain situations, it may not be possible for the system to attain a lock condition. In such cases, it is possible and usually desirable to lock to a new frequency value. This can be done by a simple operator process. This process involves commanding the control/logical unit to accept the current frequency. Under such command, the control/logic until issues a command to the count register to transfer its contents to the target register. At that point, the system is locked and operating normally.

In addition to automatically reading target frequency as described, the control system 10 provides a means to read operator input, operator selected member registers storing as many different frequencies as desired, or input from an external control system.

Target frequency may be applied to the control system from an outside source such as a "masters frequency control system". In such cases, a frequency value is imported to the system 10 in any number of ways including parallel or serial data transmission and the information is applied to the target frequency register. After doing so, the system will seek the new frequency and lock as described. This application requires circuit hardware appropriate to the protocol being used by the communications link.

If numeric display of operating frequency is desired, it is a straight forward matter to read either the count register or target register, apply any required math operations to the raw data and display the result on a numeric display. In this case, several display modes are available.

The most straight forward is the frequency counter mode. In this case, data is transferred from the count at the completion of a count sequence to the display processor 12. The display processor 12 converts the count (if necessary) from its number base to decimal, then sends the result to the display 40, 72.

When it is desired to display the operating frequency, it is often necessary to convert the value found in the count register or target register to a totally different value. As above, the selected count is transferred to the display processor where the number base is converted if necessary, and the count value may then be used as is, it may be modified by adding or subtracting an offset value, it a may be multiplied or divided or it may be multiplied or divided and the result of that operation modified by adding or subtracting an offset value. After processing as described, the new value is sent to the display.

The operator input can come from numerous sources. A popular method of tuning uses a device called a rotary shaft encoder 23. Use of a shaft encoder 23 results in tuning motion that resembles conventional electromechanical tuning mechanisms. Certain low cost shaft encoders called contacting type are mechanical in nature and produce electrical noise in addition the desired electrical signal required by the controller, making the tuning erratic and uncertain. Software used in this design greatly minimizes the effect of such noise and makes use of low cost shaft encoders practical.

The system 10 is used in equipment and applications requiring a controllable yet stable source of electrical oscillation. In a typical application, the system 10 would be used to control the frequency tuning of a radio or television receiving system. The system 10 would provide an operator tuning control or memories from which a predetermined operating frequency may be recovered. The control system would then cause the oscillator to attain the desired frequency. Once the desired operating frequency is established, the system 10 would "hold" the receiver very closely to the desired frequency regardless of environmental changes that might otherwise cause to receiver to change frequency (drift).

In other applications, the system 10 would be used to control a transmitter in similar fashion to the control of receivers just described. In still other applications, the system 10 would be used to control a transceiver. Controlling a transceiver is generally more difficult than controlling a receiver or transmitter only. In the case of the transceiver, it often happens that the transmit and receive frequencies are different. In such cases, the system provides for proper control through at least three mechanisms previously described, incremental tuning control, unlock-on-transmit control and linked controllers.

In its other applications, the system 10 would be used to control test and measure equipment or power generating equipment in a fashion similar to receivers and transmitters or transceivers. Since the system has the ability to lock the operating frequency to any specific frequency within its operating range, it can also be used to 'slave' multiple oscillators to a "master" oscillator or to any source of numeric data. This ability allows use of the system to track. An example is the satellite communications used by Ham radio operators. Transmission and reception is done on totally different frequencies. Specific correlation exists between the two. In some cases, the correlation is direct, that is, as say the receiver frequency increases, the transmit frequency also increases like amount. In other cases, the two frequencies have an inverse relationship, that is, as the receiver frequency increases, the transmit frequency decreases. Using electronic control, the system 10 can easily accept data from external sources and convert it to an appropriate operating frequency.

Referring now to FIGS. 9–13 several different applications of the system of the invention are shown.

Figure 9:
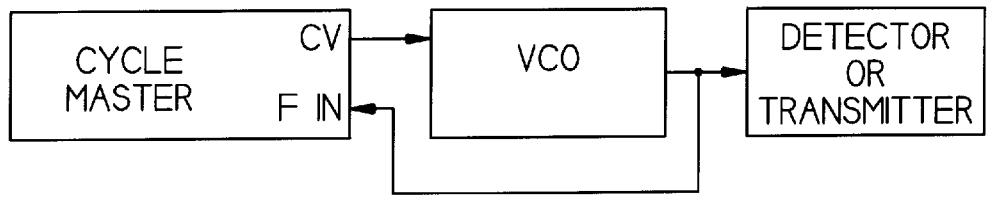
FIG. 9 illustrates connection of the system of the invention to a direct conversion receiver or transceiver.

FIG. 9 illustrates connection to a direct conversion receiver or transceiver. In this case the VCO system operates on the operating frequency so no offset or multiplier is required when programming the display.

Figure 11:
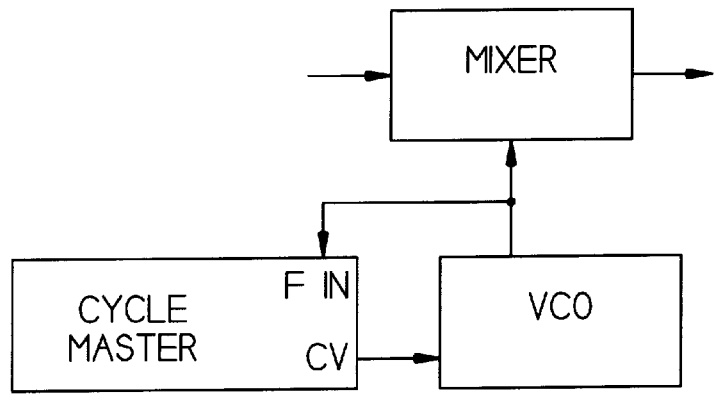
FIG. 11 illustrates connection to conventional superheterodyne receivers or transmitters.

FIG. 11 illustrates connection to conventional superheterodyne receivers or transmitters. This arrangement is often found in many kit transceivers. The local oscillator will operate at a frequency above or below the operating frequency by the amount of the intermediate frequency. In some cases, especially in equipment using high frequency intermediate frequencies (I.F.), the local oscillator may tune in reverse. That is, as the operating frequency is increasing, the local oscillator frequency is decreasing and visa versa. A reverse tuning mode is available for such cases.

Figure 10:
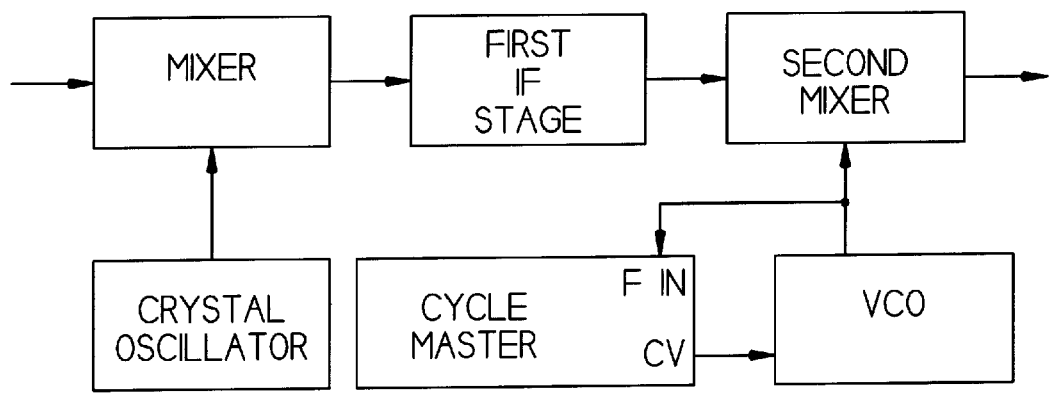
FIG. 10 illustrates a dual conversion superheterodyne connected to the system of the invention.

FIG. 10 illustrates a dual conversion superheterodyne. In this case the VCO is applied to the second mixer and almost always operates on a single frequency range regardless of the operating frequency. It will always be above or below the first I.F. by an amount equal to the second I.F. This arrangement requires as many display offsets as there are bands. Again, some of these bands may tune in reverse. The system 10 can accommodate up to sixteen bands with different offset and direction.

Figure 12:
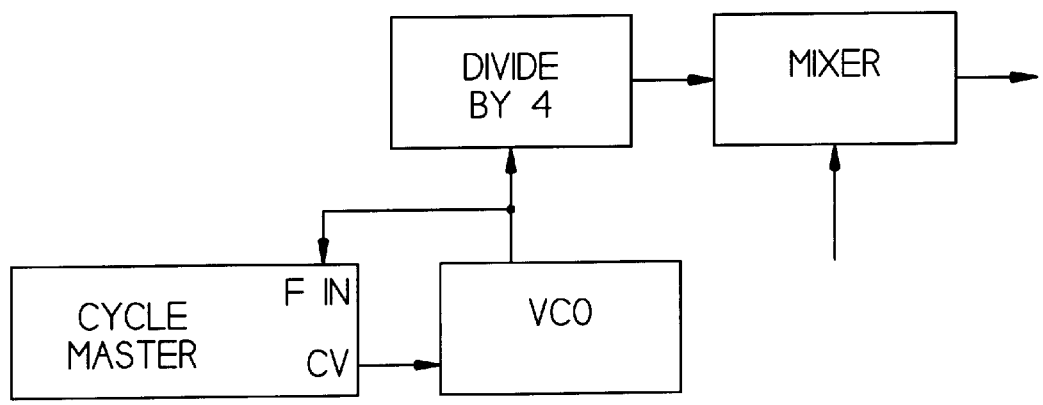
FIG. 12 illustrates a postscalar output to conventional superheterodyne receivers.
Figure 12A:
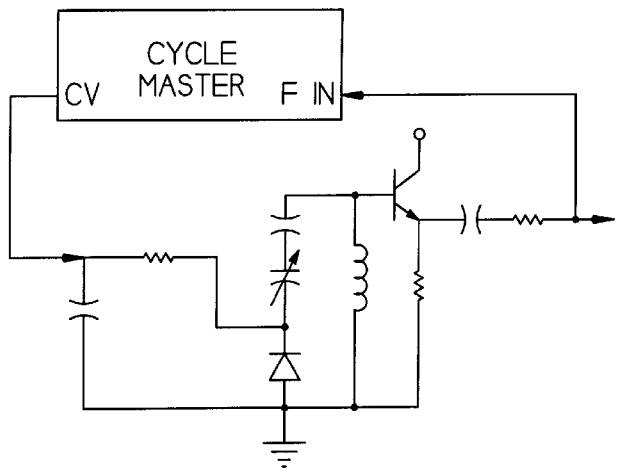
FIG. 12A illustrates connection to the control voltage input of a voltage tuned oscillator.

FIG. 12 illustrates a postscalar output to conventional superheterodyne receivers. In this case, the resolution of the present invention is increased from +/-10 Hz to +/-2.5 Hz. The display can be programmed to accommodate the divide by four postscaler, the offset, and the direction (if necessary).

Figure 13:
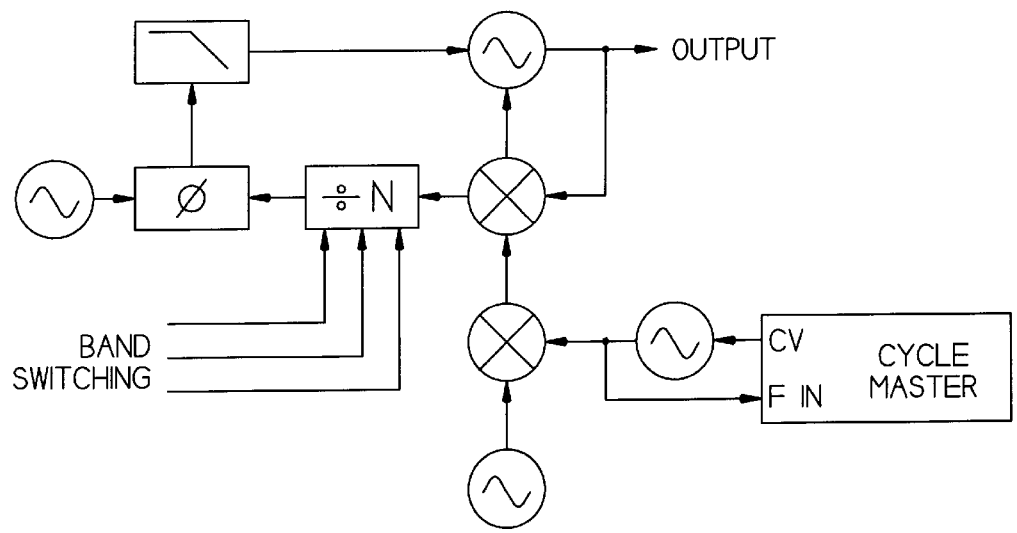
FIG. 13 illustrates a partial synthesis scheme, utilizing a phase lock loop (PLL) to provide course tuning steps and a second VCO, controlled by the system.

FIG. 13 illustrates a partial synthesis scheme, utilizing a phase lock loop (PLL) to provide course tuning steps and a second VCO, controlled by the system, to provide the finer resolution. This arrangement has several advantages. The PLL reduces the oscillator phase noise inside the loop bandwidth, provides fast band switching and uses only one crystal. The second VCO, controlled by the system 10, provides continuous tuning, digital features and excellent long-term stability.

Figure 14:
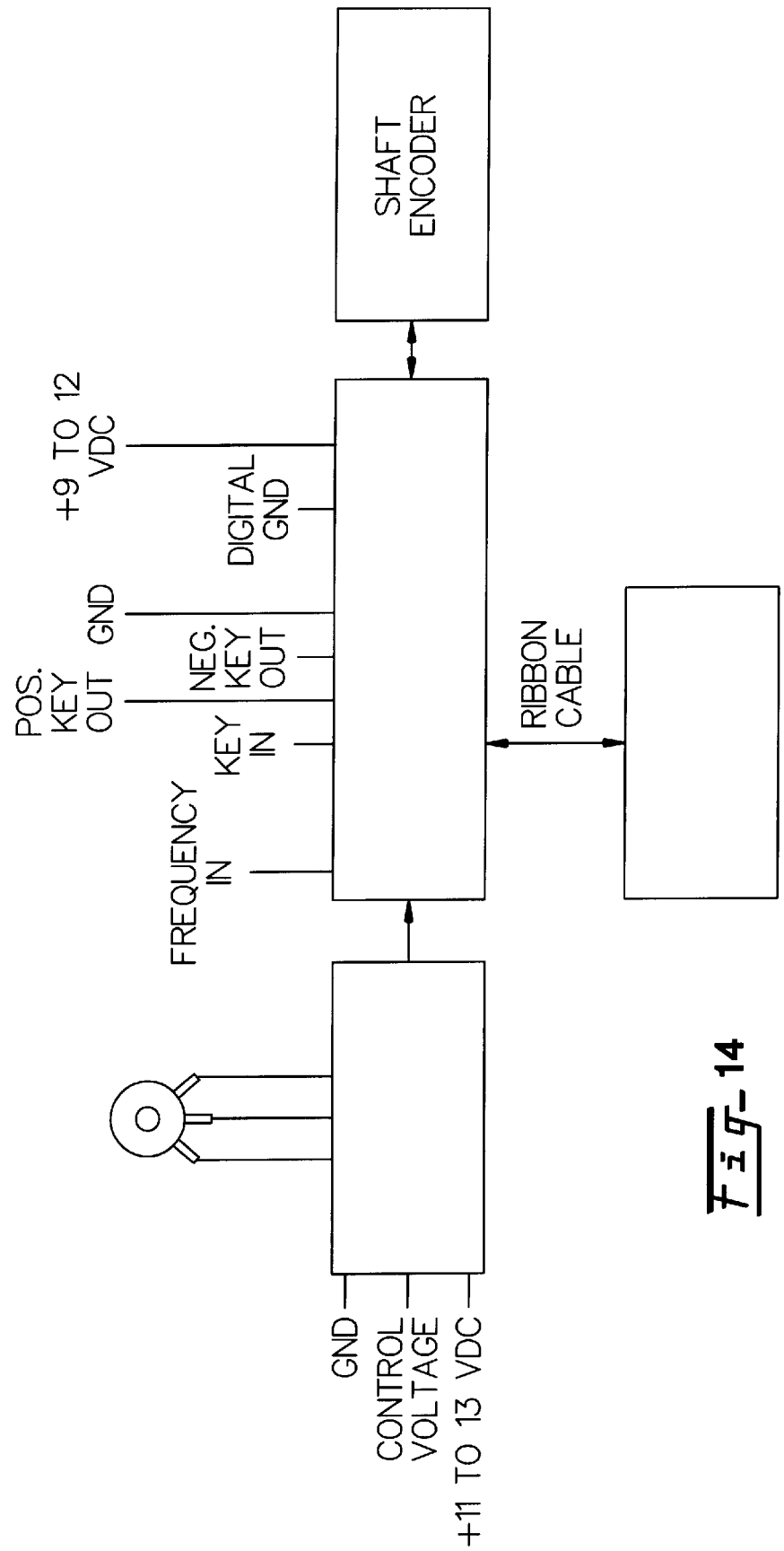
FIG. 14 illustrates the external connections made to the system in accordance with the invention.

FIG. 14 shows the external connections made to the housing of the controller 22. The two external connections which must be made is the frequency input, and the control voltage output. If the RIT feature is to be used, connections must also be made to the key in and key out pins of the controller 22 as illustrated in FIG. 14.

The foregoing specification sets forth the invention in its preferred, practical forms but the structure shown is capable of modification within a range of equivalents without departing from the invention which is to be understood is broadly novel as is commensurate with the appended claims.

What is claimed is:

1. A frequency stabilizer system comprising:

a display and control module having input means for receiving an input signal having a frequency to be stabilized and output means for outputting frequency correction signals;

said display and control module having a controller, a start up memory register for storing an initial frequency count, a count register for determining and storing an instantaneous frequency count, a count gate for selectively gating a feedback signal to said count register, at least one target register for storing a desired frequency count, a comparator for comparing said instantaneous frequency count to said desired frequency count, and a control logic unit for sending control signals to said count register, said count gate, and said target register;

an integrator module functionally connected to said display and control module for receiving said frequency correction signals therefrom;

oscillator means functionally connected to said integrator module for receiving a correction voltage and having output means for outputting an output signal having a corrected frequency in response thereto;

whereby said control logic unit is connected to input means which allow for selective control by said controller or by operator input.

2. The system of claim 1 wherein said display and control module includes memory means for storing at least one target frequency.

3. The system of claim 1 wherein said oscillator output is connected to the input means of said display and control module for comparison to a target frequency.

4. The system of claim 2 wherein said memory means can store several target frequencies.

5. The system of claim 1 including means for increasing a frequency range of said corrected frequency.

6. The system of claim 1 including means for manually inputting a target frequency.

7. The system of claim 1 wherein said controller has an input means for accepting both transmit and receive request signals from a transceiver, said controller having means for locking to a first frequency when said transceiver is receiving, and disengaging from said first frequency upon receipt of said transmit request signal.

8. A method of tuning a frequency stabilizer, said frequency stabilizer connected to receive a tuning signal from a manual tuning device which may be rotated at a desired speed in a desired direction to attain a target frequency to be stabilized, comprising the steps of:

driving an output signal of an oscillator at an open loop frequency at a direction and rate proportional to instantaneous speed and direction of rotation of said manual tuning device by sending said tuning signal to said oscillator;

sensing when said manual tuning device is no longer rotating and immediately terminating said tuning signal;

measuring an instantaneous frequency of said output signal of said oscillator in response to termination of said tuning signal;

storing the instantaneous frequency as the target frequency;

measuring said output signal for a predetermined period of time to establish a frequency count;

storing said frequency count in a count register;

comparing said frequency count to said target frequency;

sending a correction signal to said oscillator until said instantaneous frequency count is equal to the target frequency thereby stabilizing said output signal.

9. The method of claim 8 wherein stabilizing the output signal comprises the steps of;

measuring said output signal for a predetermined period of time to establish a frequency count;

storing said frequency count in a count register;

comparing said frequency count to said target frequency;

sending a correction signal to said oscillator until said instantaneous frequency count is equal to the target frequency.

10. The method of claim 8 wherein said predetermined period of time varies as:

$3.125 * 2^n$ ms where n=(0,1,2,3,4) and where;

If $F_{err}$=0 and n<4 then n=n+1; and,

If $F_{err}$>16 then n=0.

11. A method of stabilizing an input signal having a varying frequency comprising the steps of:

measuring said varying frequency for a first predetermined period of time to establish an initial frequency count;

storing said initial frequency count in a count register;

comparing said initial frequency count to a target frequency;

sending a correction signal to an oscillator, said oscillator outputting an output signal in response to said correction signal;

measuring said output signal for a second predetermined period of time to establish an instantaneous frequency count;

storing said instantaneous frequency count in said count register;

comparing said instantaneous frequency count to said target frequency;

sending said correction signal to said oscillator until said instantaneous frequency count is locked to said target frequency.

12. The method of claim 11 wherein said input signal alternates between a transmit and a receive carrier signal for a transceiver, said transceiver capable of transmitting control signals;

in response to a transmit enable control signal, storing said instantaneous frequency count corresponding to said receive carrier signal, establishing an instantaneous frequency count corresponding to said transmit carrier signal, and locking said instantaneous frequency count corresponding to said transmit carrier signal to a transmit target frequency.

* * * * *